(12) United States Patent
Ho

(10) Patent No.: US 9,137,899 B2
(45) Date of Patent: Sep. 15, 2015

(54) PROCESS OF ELECTRONIC STRUCTURE AND ELECTRONIC STRUCTURE

(75) Inventor: Chung W. Ho, Taipei (TW)

(73) Assignee: Subtron Technology Co., Ltd., Hsinchu (TW)

( * ) Notice: Subject to any disclaimer, the term of this patent is extended or adjusted under 35 U.S.C. 154(b) by 137 days.

(21) Appl. No.: 13/346,738

(22) Filed: Jan. 10, 2012

(65) Prior Publication Data
US 2012/0228015 A1 Sep. 13, 2012

(30) Foreign Application Priority Data
Mar. 9, 2011 (TW) .............................. 100107938 A

(51) Int. Cl.
*H05K 3/00* (2006.01)
*H05K 1/18* (2006.01)
(Continued)

(52) U.S. Cl.
CPC ............ *H05K 1/185* (2013.01); *H01L 21/6835* (2013.01); *H05K 3/0097* (2013.01); *H05K 3/4682* (2013.01); *H01L 21/4857* (2013.01); *H01L 24/25* (2013.01); *H01L 24/82* (2013.01); *H01L 2221/68318* (2013.01); *H01L 2221/68345* (2013.01); *H01L 2224/2518* (2013.01); *H01L 2224/82005* (2013.01); *H05K 1/116* (2013.01); *H05K 3/4602* (2013.01); *H05K 2201/09718* (2013.01); *H05K 2203/1469* (2013.01); *H05K 2203/175* (2013.01); *Y10T 29/4913* (2015.01); *Y10T 29/49126* (2015.01); *Y10T 29/49155* (2015.01); *Y10T 29/49156* (2015.01); *Y10T 29/49165* (2015.01)

(58) Field of Classification Search
CPC ..... H05K 3/007; H05K 3/4682; H05K 3/025; H05K 3/205; H05K 2203/0147; H05K 2203/0152; H05K 2203/0156; H05K 2203/016; H05K 1/185; H05K 1/116; H01L 21/6825; H01L 21/4857; Y10T 29/49165; Y10T 29/49126; Y10T 21/49155; Y10T 29/49156
USPC ........ 29/842, 829, 825, 592.1, 846, 852, 832, 29/847, 830
See application file for complete search history.

(56) References Cited

U.S. PATENT DOCUMENTS 6,660,354 B2 * 12/2003 Suwa et al. ................... 428/41.8
7,223,687 B1 * 5/2007 Ho et al. ........................ 438/622
7,543,374 B2 * 6/2009 Nakamura ...................... 29/846
(Continued)

FOREIGN PATENT DOCUMENTS

| TW | 200715930 | 4/2007 |
| TW | 200726355 | 7/2007 |
| TW | 200730064 | 8/2007 |

OTHER PUBLICATIONS

"Office Action of Taiwan Counterpart Application", issued on Apr. 22, 2013, p. 1-p. 10.

*Primary Examiner* — Peter DungBa Vo
*Assistant Examiner* — Azm Parvez
(74) *Attorney, Agent, or Firm* — Jianq Chyun IP Office

(57) ABSTRACT

A process of electronic structure is provided. First, a carrier board is provided, in which the carrier board has a first surface. Next, a first release layer is formed on the first surface of the carrier board. The first release layer has property of withstanding high-temperature and temporary adhesion capability and the first release layer entirely or mostly overlays the first surface. Then, a built-up structure is formed on the first release layer. Finally, a separating process is performed so that the built-up structure is separated from the carrier board to form an electronic structure.

25 Claims, 17 Drawing Sheets

(51) Int. Cl.
*H01L 21/683* (2006.01)
*H05K 1/11* (2006.01)
*H05K 3/46* (2006.01)
*H01L 21/48* (2006.01)
*H01L 23/00* (2006.01)

(56) References Cited

U.S. PATENT DOCUMENTS 7,716,826 B2 * 5/2010 Nakamura ............... 29/846
8,209,860 B2 * 7/2012 An et al. ................. 29/842

* cited by examiner

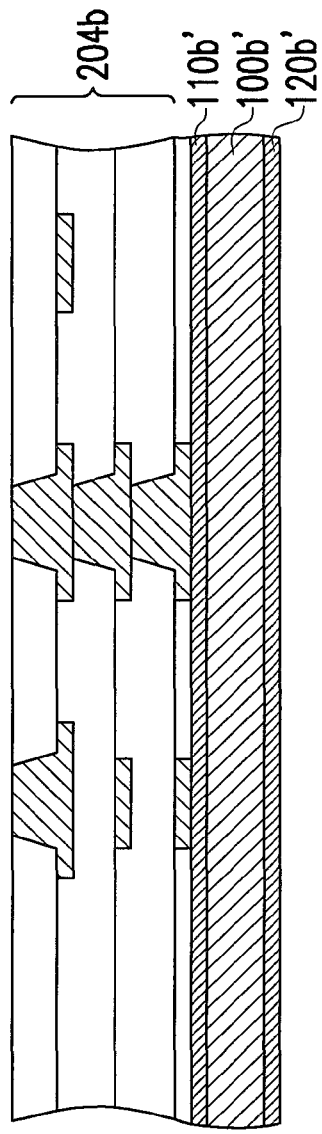
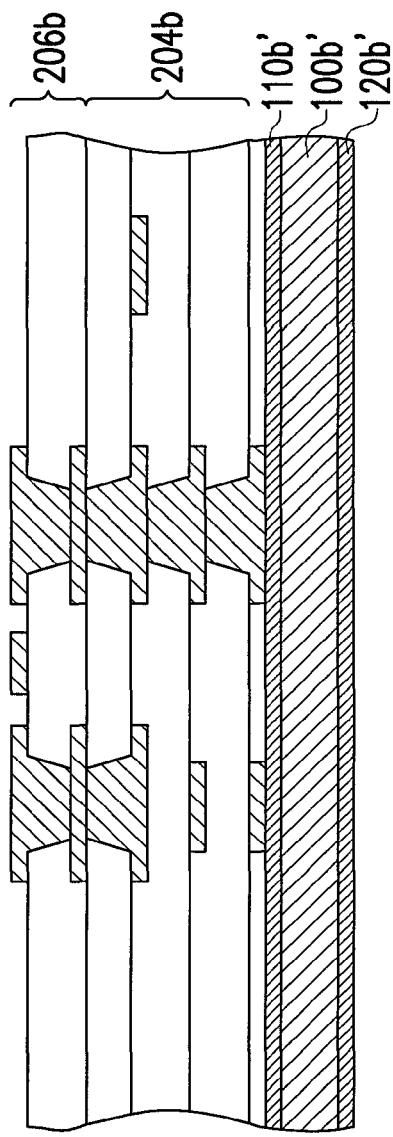

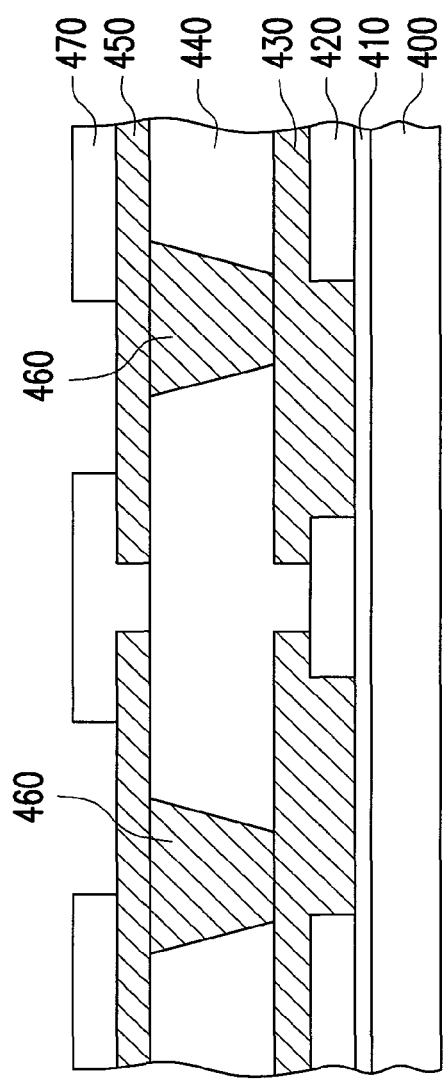
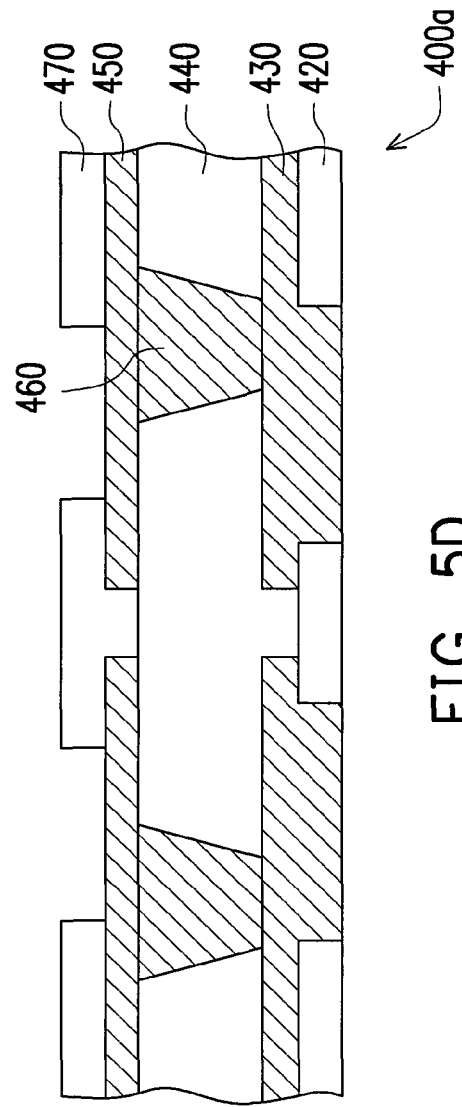
FIG. 5C
FIG. 5D

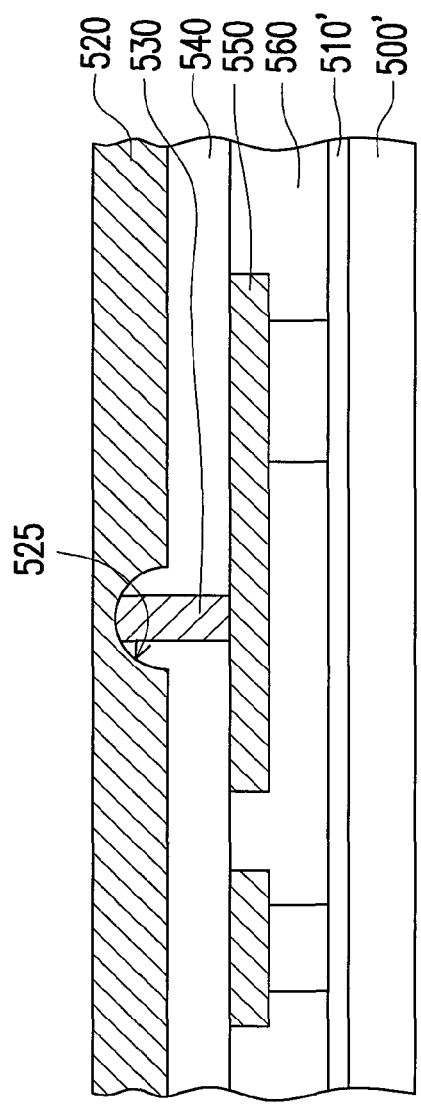
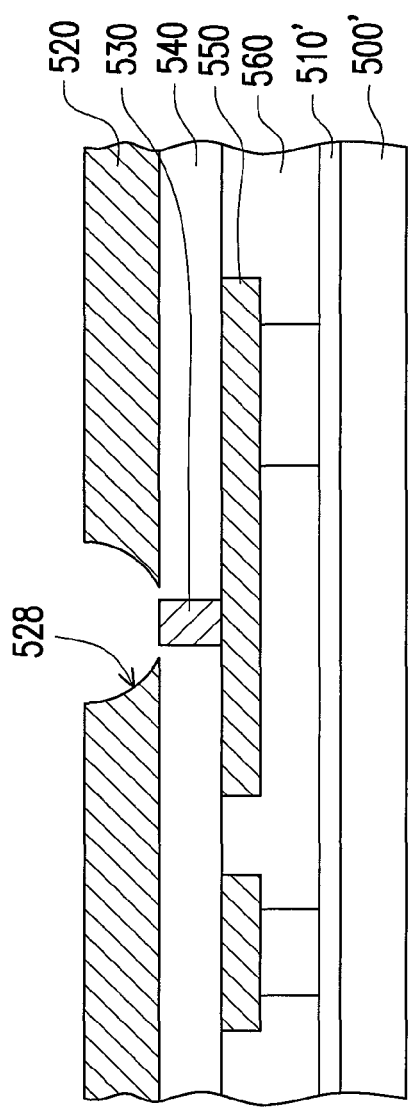
FIG. 6C
FIG. 6D

PROCESS OF ELECTRONIC STRUCTURE AND ELECTRONIC STRUCTURE

CROSS-REFERENCE TO RELATED APPLICATION

This application claims the priority benefit of Taiwan application serial no. 100107938, filed on Mar. 9, 2011. The entirety of the above-mentioned patent application is hereby incorporated by reference herein and made a part of this specification.

BACKGROUND OF THE INVENTION

1. Field of the Invention

The invention generally relates to a circuit board, and more particularly, to a process of electronic structure.

2. Description of Related Art

The process of a circuit board can be roughly divided into laminating method and building-up method. The fabrication principle of the laminating method is to form a patterned metal circuit layer on a single surface or both surfaces of a dielectric layer. Then, a bonding sheet and a metal sheet are added on the circuit layers and meanwhile the metal sheet and the bonding sheet are heated and pressed so that the metal sheet is bonded with an adjacent circuit layer. After that, conductive through vias are fabricated on the laminated layers so that each of the circuit layers and the metal sheet can be electrically connected to each other through the conductive through via. On the other hand, the fabrication principle of the building-up method is to sequentially form a circuit layer, a dielectric layer and a metal layer respectively on both opposite surfaces of a carrier board, and the adjacent circuit layer and metal layer are electrically connected to each other through conductive blind vias formed in the process.

SUMMARY OF THE INVENTION

Accordingly, the invention provides a process of electronic structure. First, a carrier board is provided, in which the carrier board has a first surface. Next, a first release layer is formed on the first surface of the carrier board. The first release layer has property of withstanding high-temperature and temporary adhesion capability and the first release layer entirely or mostly overlays the first surface. Then, a built-up structure is formed on the first release layer. Finally, a separating process is performed so that the built-up structure is separated from the carrier board to form an electronic structure.

Alternatively, before the separating process is performed as described above, the adhesion is first weakened between the carrier board and the built-up structure at the panel edges (1-2 cm wide) by a process step. A second carrier board is provided which is aligned and pressed against the top surface of the built-up structure such that when the separating process is performed from the first carrier board, the built-up structure is transferred to the second carrier for further processing before separating the built-up structure from it.

The components in the built-up structure include copper foils, dielectric layers, cones, metal panels, active and passive discrete devices.

The invention also provides an electronic structure, which includes a first built-up structure and a second built-up structure. The first built-up structure has a planar surface and includes at least one first conductive layer and at least one first dielectric layer. The second built-up structure is disposed on the planar surface of the first built-up structure and includes at least one second conductive layer and at least one second dielectric layer.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 2A-2H are cross-sectional diagrams showing a process of electronic structure according to another embodiment of the invention.

FIGS. 5A-5D are cross-sectional diagrams showing a process of electronic structure according to another embodiment of the invention.

FIGS. 6A-6E are cross-sectional diagrams showing a process of electronic structure according to yet another embodiment of the invention.

DESCRIPTION OF THE EMBODIMENTS

Figure 1A:
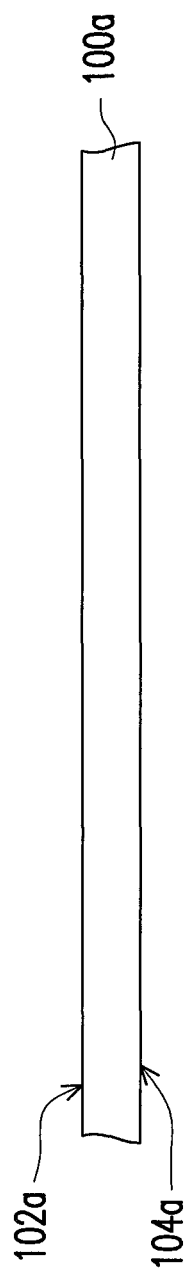
FIGS. 1A-1G are cross-sectional diagrams showing a process of electronic structure according to an embodiment of the invention.

FIGS. 1A-1G are cross-sectional diagrams showing a process of electronic structure according to an embodiment of the invention. Referring to FIG. 1A, the process of electronic structure of the embodiment includes following steps. First, a carrier board 100a is provided, which has a first surface 102a and a second surface 104a opposite to the first surface 102a. In the embodiment, the material of the carrier board 100a includes a metallic material, a dielectric material or a compound material, in which the metallic material includes copper, stainless steel or aluminium. The dielectric material includes glass, ceramic, glass/epoxy group or polyimide. The thickness of the carrier board 100a ranges between 0.1 mm and 2.0 mm. The compound material includes two copper foils overlaying two opposite surfaces of a circuit board containing glass fiber resin material.

Figure 1B:
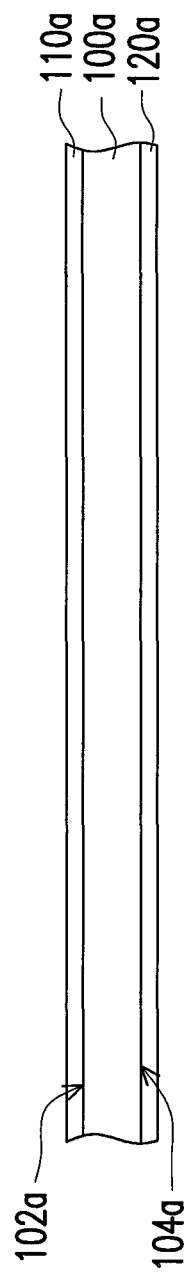

Then, referring to FIG. 1B, a first release layer 110a and a second release layer 120a are respectively formed on the first surface 102a and the second surface 104a of the carrier board 100a. In the embodiment, in particular, both the first release layer 110a and the second release layer 120a have property of withstanding high-temperature and temporary adhesion capability, and the first release layer 110a and the second release layer 120a respectively entirely overlay the first surface 102a and the second surface 104a of the carrier board 100a. The material of the first release layer 110a and the second release layer 120a includes siloxane, silicone, resin or high-temperature pressure-sensitive adhesive, in which the resin is, for example, thermoplastic resin with amide base, ester base or ether base component.

Figure 1C:
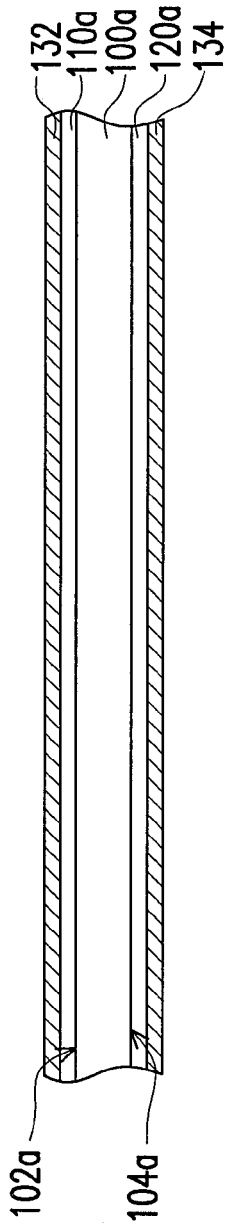

Further referring to FIG. 1C, a first conductive layer 132 and a second conductive layer 134 are respectively formed on the first release layer 110a and the second release layer 120a, and the first conductive layer 132 and the second conductive layer 134 are respectively bound with the first release layer 110a and the second release layer 120a thereon by using laminating or other appropriate ways. Since the first release layer 110a and the second release layer 120a have property of withstanding high-temperature and temporary adhesion capability, when the first conductive layer 132 and the second conductive layer 134 are respectively disposed on the first release layer 110a and the second release layer 120a, the first conductive layer 132 and the second conductive layer 134 can be respectively adhered to the first surface 102a and the second surface 104a of the carrier board 100a through the first release layer 110a and the second release layer 120a.

Figure 1D:
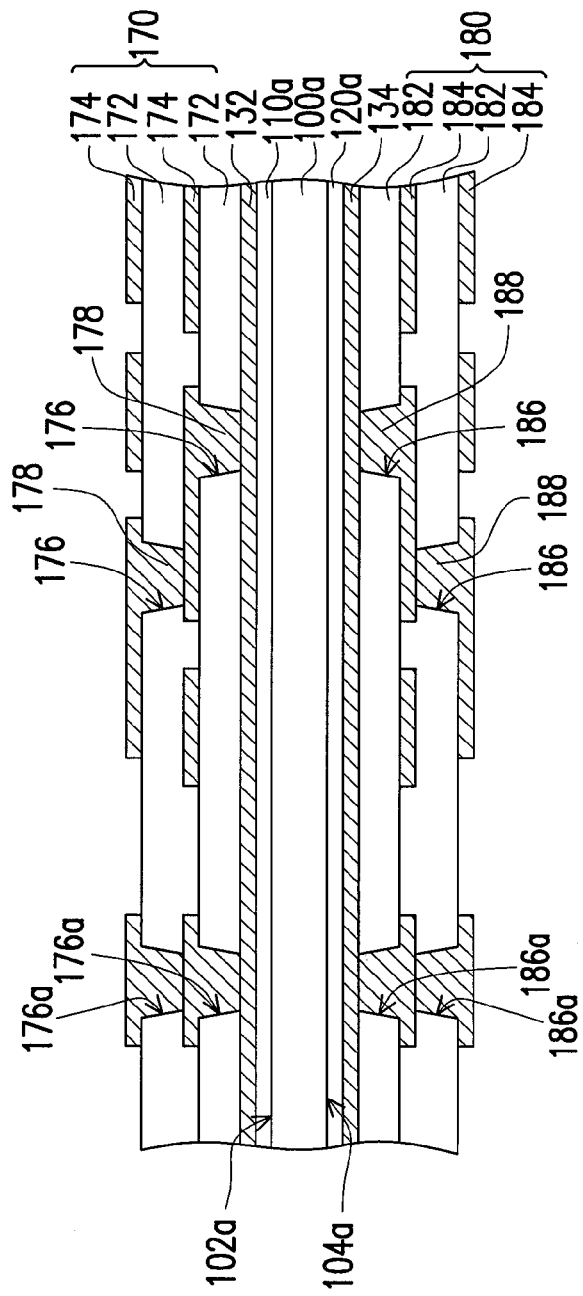

Further referring to FIG. 1D, a first built-up structure 170 and a second built-up structure 180 are respectively formed on the first conductive layer 132 and the second conductive layer 134 by using building-up method. In the embodiment, in more details, the first built-up structure 170 includes a plurality of third dielectric layers 172, a plurality of third conductive layers 174, a plurality of first blind vias 176 and a plurality of first conductive blind vias 176a, and the first conductive blind vias 176a are stacked and respectively connected to the first conductive layer 132 and the third conductive layers 174. In the same way, the second built-up structure 180 includes a plurality of fourth dielectric layers 182, a plurality of fourth conductive layers 184, a plurality of second blind vias 186 and a plurality of second conductive blind vias 186a. The method of forming the above-mentioned first built-up structure 170 and the second built-up structure 180 includes semi additive process (SAP), etching process, laser drilling process and photolithography.

It should be noted that, in other embodiments, the quantities of the dielectric layers, the conductive layers and the conductive blind vias of the first built-up structure 170 and the second built-up structure 180 can be adjusted depending on the real need. In addition, in other embodiments, prior to fabricating the first built-up structure 170 and the second built-up structure 180, the first conductive layer 132 and the second conductive layer 134 can be patterned in advance for forming a desired circuit pattern.

Figure 1E:
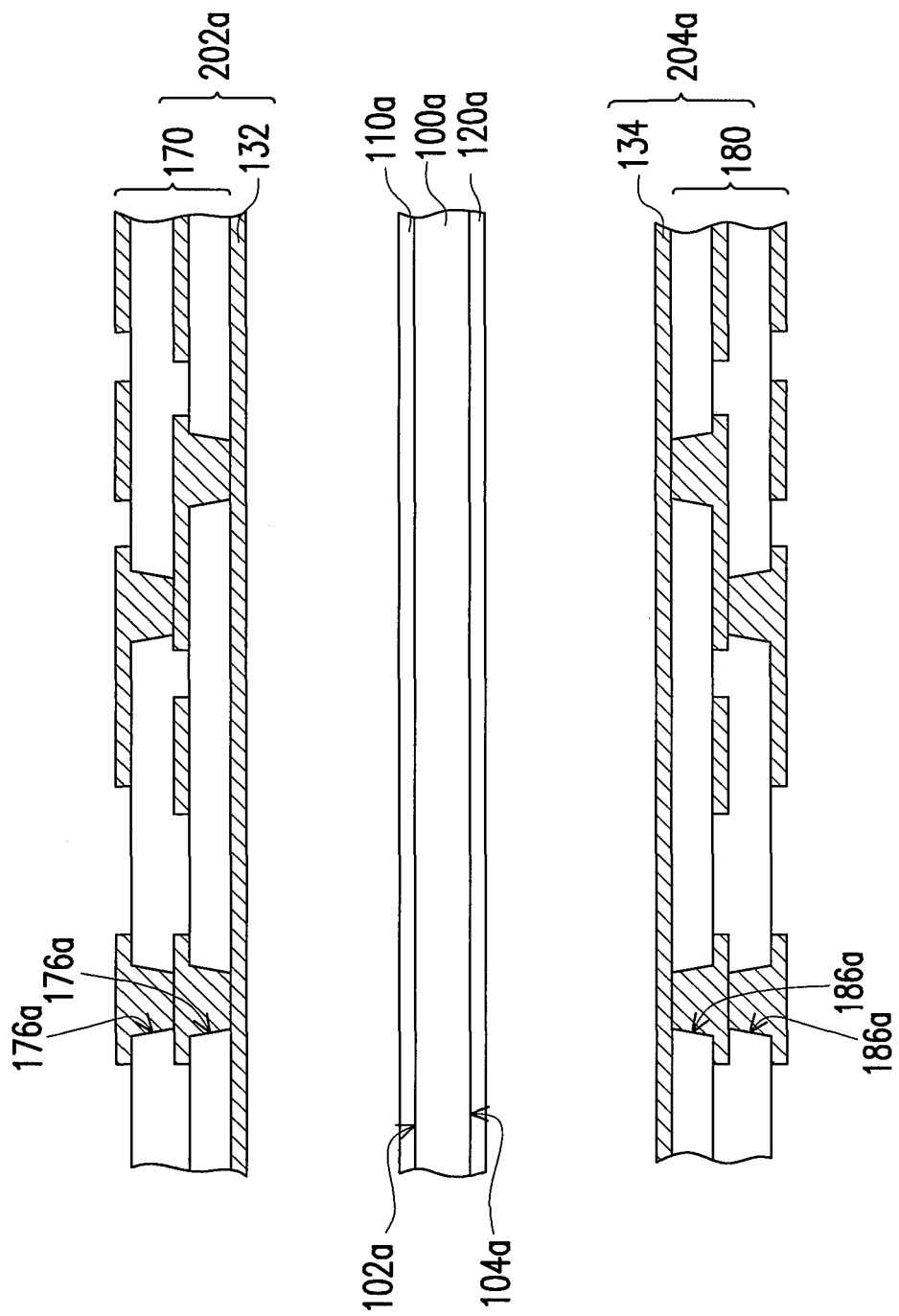

Finally, referring to FIG. 1E, a separating process is performed, so that the first built-up structure 170 and the second built-up structure 180 are respectively separated from the carrier board 100a to form two electronic structures, which are, for example, a first circuit board 202a and a second circuit board 204a. In more details, in the embodiment, since the first release layer 110a and the second release layer 120a have temporary adhesion capability, so that during performing the separating process, the adhesion at the interface between the first conductive layer 132 and the first release layer 110a and the adhesion at the interface between the second conductive layer 134 and the second release layer 120a must be released. After the separating process, the first built-up structure 170 and the first conductive layer 132 together form the first circuit board 202a and the second built-up structure 180 and the second conductive layer 134 together form the second circuit board 204a. In the embodiment, the separating process includes physical lift-off process. At the time, two circuit boards (i.e., the first circuit board 202a and the second circuit board 204a) have been completed in a single process.

Figure 1F:
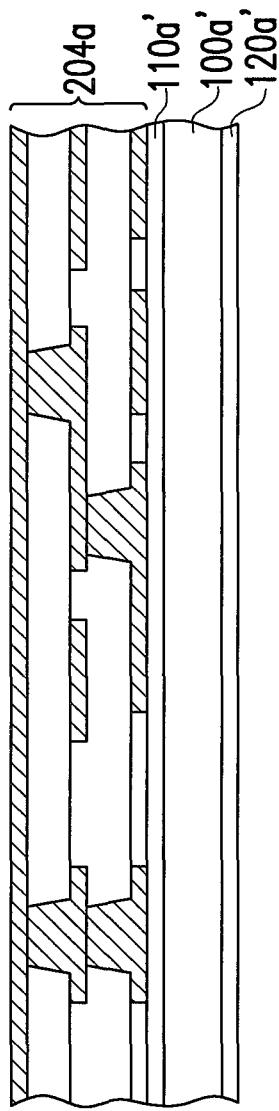
Figure 1G:
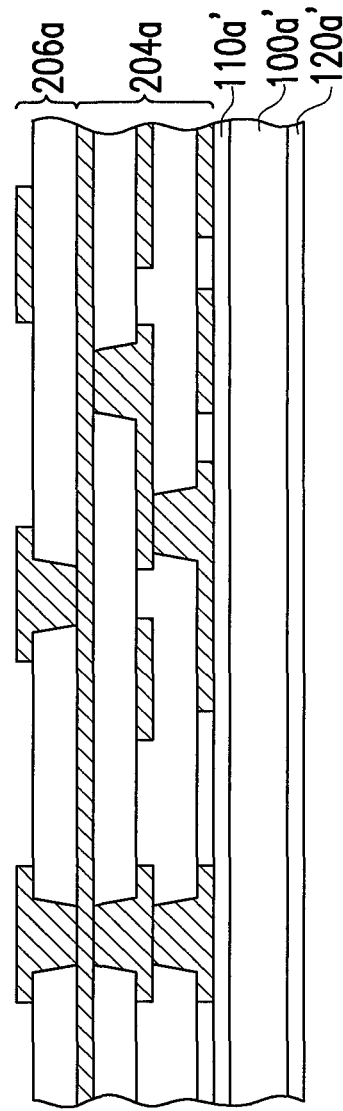

After that, a board-transferring process is performed so that the second circuit board 204a (or the first circuit board 202a) is transferred to another carrier board 100a' with the first release layer 110a' and the second release layer 120a' formed thereon and opposite to each other, as shown by FIG. 1F. Further referring to FIG. 1G, a built-up structure 206a is formed on the second circuit board 204a, in which the built-up structure 206a includes at least one dielectric layer, at least one conductive layer, at least one conductive through via and a solder-resisting layer, where the configuring of the built-up structure 206a is not limited by the invention.

Figure 2A:
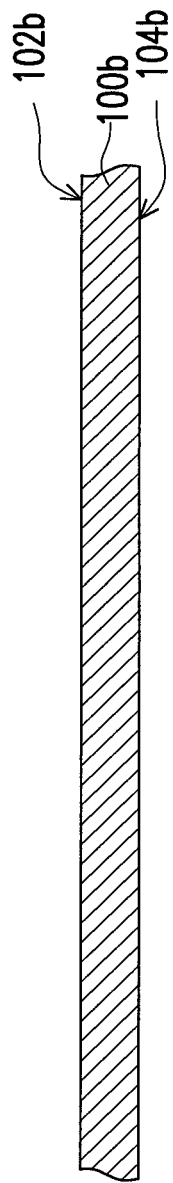

FIGS. 2A-2G are cross-sectional diagrams showing a process of electronic structure according to another embodiment of the invention. Referring to FIG. 2A, the process of electronic structure of the embodiment includes following steps. First, a carrier board 100b is provided, which has a first surface 102b and a second surface 104b opposite to the first surface 102b. In the embodiment, the material of the carrier board 100b includes a metallic material, for example, stainless steel. The thickness of the carrier board 100b ranges between 0.1 mm and 2.0 mm.

Figure 2B:
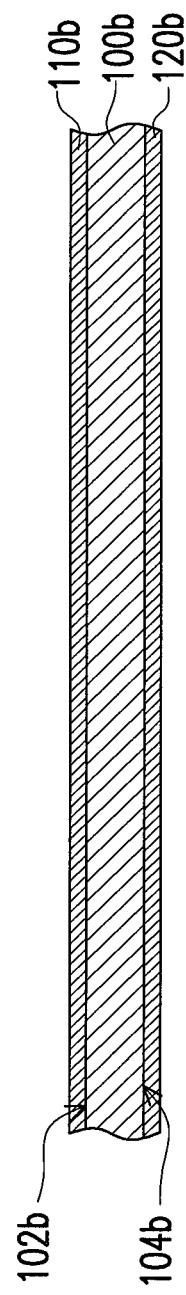

Then, referring to FIG. 2B, a first release layer 110b and a second release layer 120b are respectively formed on the first surface 102b and the second surface 104b of the carrier board 100b. In the embodiment, in particular, both the first release layer 110b and the second release layer 120b have property of withstanding high-temperature and temporary adhesion capability, and the first release layer 110b and the second release layer 120b respectively entirely overlay the first surface 102b and the second surface 104b. The first release layer 110b and the second release layer 120b in the embodiment is a dielectric layer, for example, siloxane or silicone resin.

Figure 2C:
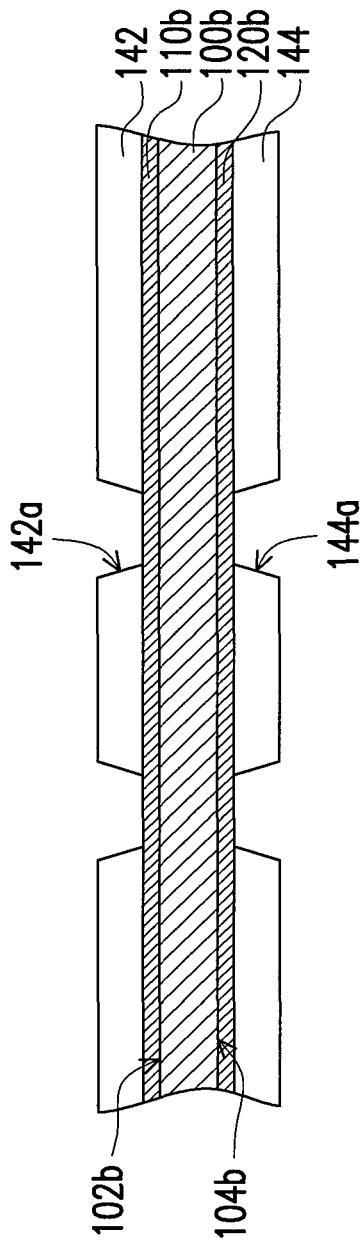
Figure 2D:
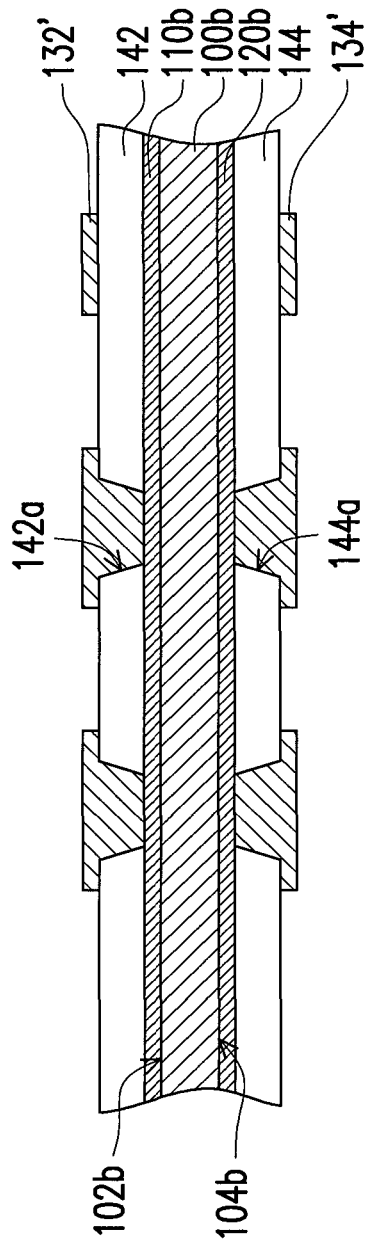

Further referring to FIG. 2C, a first dielectric layer 142 and a second dielectric layer 144 are respectively formed on the first release layer 110b and the second release layer 120b by using screen printing, laminating or other appropriate ways, and a plurality of blind vias 142a and 144a are formed respectively on the first dielectric layer 142 and the second dielectric layer 144 by using printing, photo exposing and developing or laser process shown by FIG. 2C. Then referring to FIG. 2D, a conductive layer is respectively formed on the first dielectric layer 142 and the second dielectric layer 144 and in the blind vias 142a and 144a, and a first conductive layer 132' and a second conductive layer 134' are formed by patterning the conductive layer through etching process or semi additive process (SAP). Meanwhile, the first dielectric layer 142 and the first conductive layer 132' are bound with the first release layer 110b thereon, and the second dielectric layer 144 and the second conductive layer 134' are bound with the second release layer 120b thereon. Since the first release layer 110b and the second release layer 120b in the embodiment have property of withstanding high-temperature and temporary adhesion capability, when the first dielectric layer 142 and the second dielectric layer 144 are respectively disposed on the first release layer 110b and the second release layer 120b, the first dielectric layer 142 and the second dielectric layer 144 can be entirely adhered onto the first release layer 110b and the second release layer 120b. When the first dielectric layer 142 and the first conductive layer 132' are bound with the first release layer 110b and the second dielectric layer 144 and the second conductive layer 134' are bound with the second release layer 120b by using screen printing, laminating or other appropriate ways, the first dielectric layer 142 and the first conductive layer 132' can be fixed onto the first surface 102b of the carrier board 100b and the second dielectric layer 144 and the second conductive layer 134' can be fixed onto the second surface 104b of the carrier board 100b. Then, the first conductive layer 132' and the second conductive layer 134' are patterned by using etching process or semi additive process (SAP).

Figure 2E:
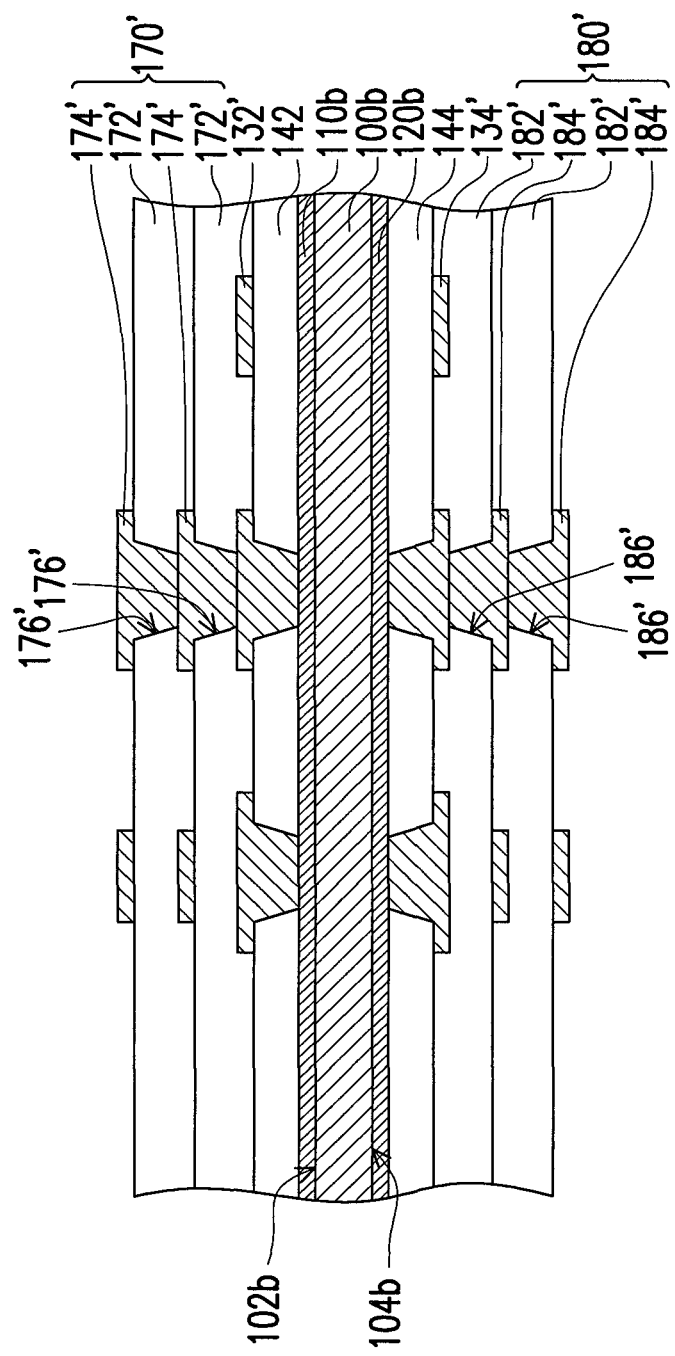

Further referring to FIG. 2E, a first built-up structure 170' and a second built-up structure 180' are respectively formed on the first conductive layer 132' and the second conductive layer 134' by using building-up method. In the embodiment, the first built-up structure 170' includes a plurality of third dielectric layers 172', a plurality of third conductive layers 174' and a plurality of first conductive blind vias 176', in which the first conductive blind vias 176' are respectively connected to the first conductive layer 132' and the third conductive layers 174'. In the same way, the second built-up structure 180' includes a plurality of fourth dielectric layers 182', a plurality of fourth conductive layers 184' and a plurality of second conductive blind vias 186', in which the second conductive blind vias 186' are respectively connected to the second conductive layer 134' and the fourth conductive layers 184'. The method of forming the above-mentioned first built-up structure 170' and the second built-up structure 180' includes laminating process, etching process, laser drilling process and photolithography.

It should be noted that, in other embodiments, the quantities of the dielectric layers, the conductive layers and the conductive blind vias of the first built-up structure 170' and the second built-up structure 180' can be adjusted depending on the real need.

Figure 2F:
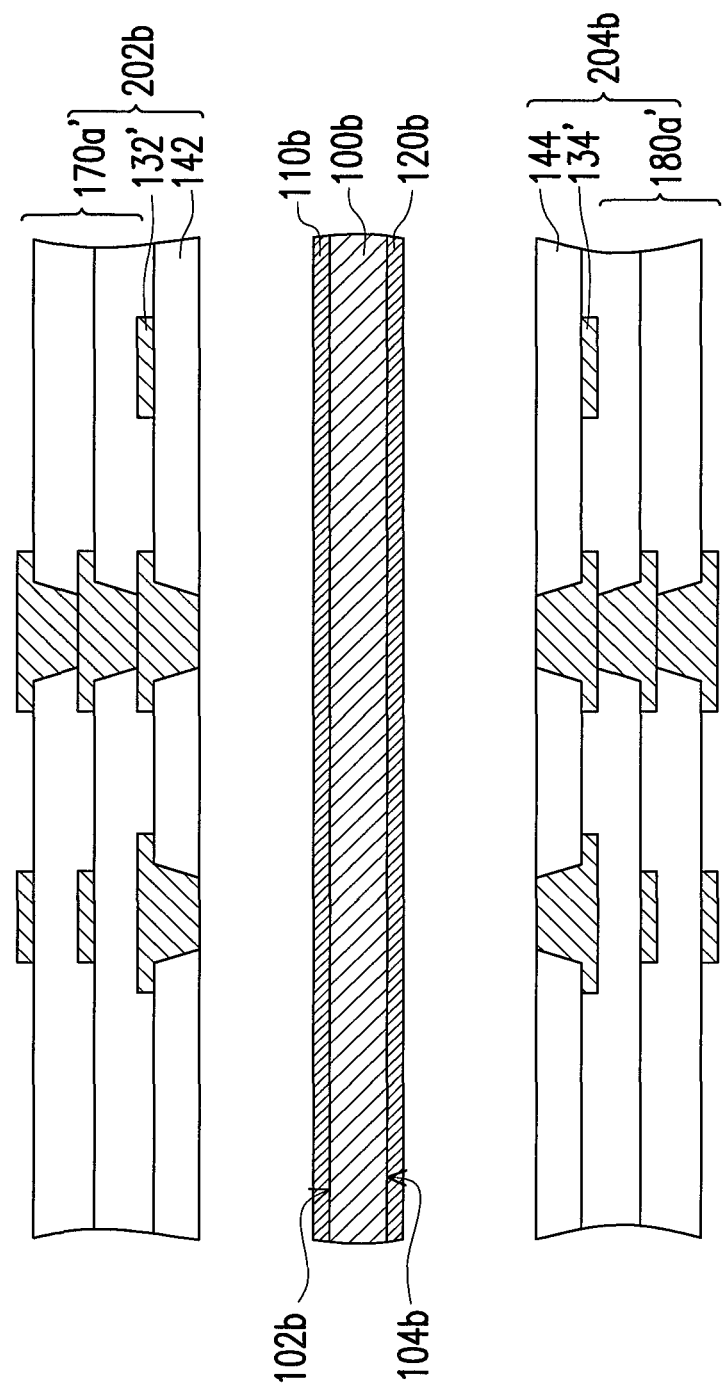

Finally, referring to FIG. 2F, a separating process is performed, so that the first built-up structure 170' and the second built-up structure 180' are respectively separated from the carrier board 100b to form two electronic structures, which are, for example, a first circuit board 202b and a second circuit board 204b. In more details, in the embodiment, since the first release layer 110b and the second release layer 120b have temporary adhesion capability, so that during performing the separating process, the adhesion at the interface between the first release layer 110b and the first dielectric layer 142 and the adhesion at the interface between the second release layer 120b and the second dielectric layer 144 must be released. After the separating process, the first built-up structure 170a', the first conductive layer 132' and the first dielectric layer 142 together form the first circuit board 202b and the second built-up structure 180a', the second conductive layer 134' and the second dielectric layer 144 together form the second circuit board 204b. In the embodiment, the separating process includes physical lift-off process. At the time, two circuit boards (i.e., the first circuit board 202b and the second circuit board 204b) are completed in a single process.

After that, a board-transferring process are performed so that the second circuit board 204b (or the first circuit board 202b) is transferred to another carrier board 100b' with the first release layer 110b' and the second release layer 120b' formed thereon and opposite to each other, as shown by FIG. 2G. Further referring to FIG. 2H, a built-up structure 206b is formed on the second circuit board 204b, in which the built-up structure 206b includes at least one dielectric layer, at least one conductive layer, at least one conductive through via and a solder-resisting layer, where the configuring of the built-up structure 206b is not limited by the invention.

Figure 3:
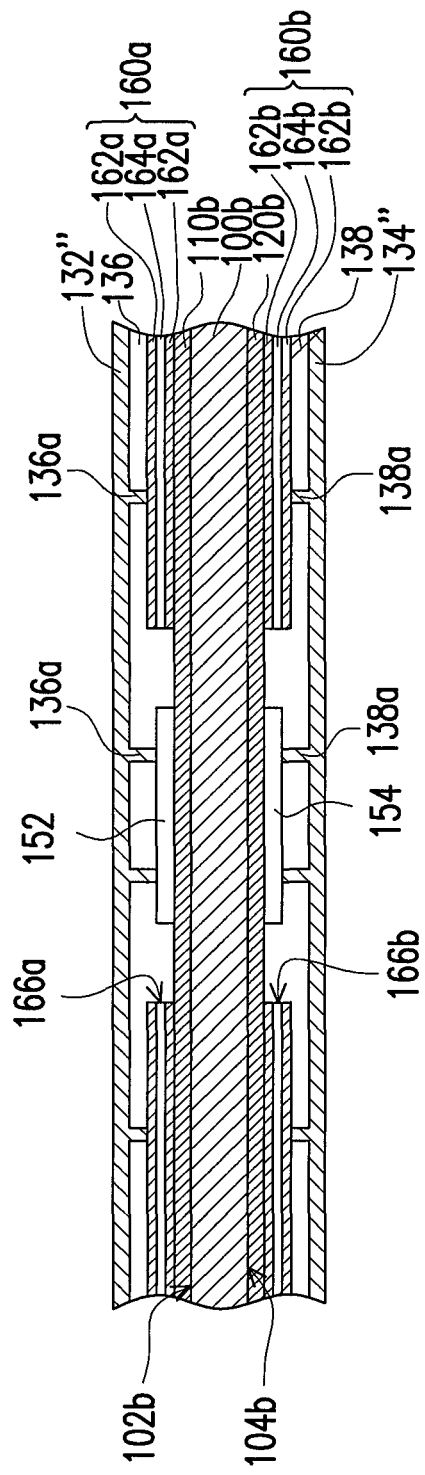
FIG. 3 is a cross-sectional diagram showing a process of electronic structure according to yet another embodiment of the invention.

It should be noted that in other embodiments, as shown by FIG. 3, after the first release layer 110b and the second release layer 120b are respectively disposed on the first surface 102b and the second surface 104b of the carrier board 100b, a first electronic device 152 and a second electronic device 154 can be respectively disposed on the first release layer 110b and the second release layer 120b as well. The first electronic device 152 and the second electronic device 154 herein include active device or passive device, in which the active device is, for example, IC chip and the passive device is, for example, resistor, capacitor or inductor.

Referring to FIG. 3 again, the process of electronic structure can include disposing a first core layer 160a and a second core layer 160b respectively on the first release layer 110b and the second release layer 120b. The first core layer 160a is formed by two fifth conductive layers 162a and a fifth dielectric layer 164a alternately disposed, and the first core layer 160a has a first opening 166a, in which the first opening 166a exposes out the first electronic device 152. The second core layer 160b is formed by two sixth conductive layers 162b and a sixth dielectric layer 164b alternately disposed, and the second core layer 160b has a second opening 166b, in which the second opening 166b exposes out the second electronic device 154.

Then, a seventh dielectric layer 136 and an eighth dielectric layer 138 are respectively formed on the first release layer 110b and the second release layer 120b, and a first conductive layer 132" and a second conductive layer 134" are respectively formed on the seventh dielectric layer 136 and the eighth dielectric layer 138. The seventh dielectric layer 136 overlays the first core layer 160a, the first electronic device 152 and a part of the first release layer 110b and has a plurality of first blind vias 136a, in which the first conductive layer 132" is electrically connected to the first electronic device 152 and the first core layer 160a through the first blind vias 136a. Similarly, the eighth dielectric layer 138 overlays the second core layer 160b, the second electronic device 154 and a part of the second release layer 120b and has a plurality of second blind vias 138a, in which the second conductive layer 134" is electrically connected to the second electronic device 154 and the second core layer 160b through the second blind vias 138a.

After respectively forming the first conductive layer 132" and the second conductive layer 134" at the seventh dielectric layer 136 and the eighth dielectric layer 138, the process steps in the above-mentioned embodiments shown by FIG. 1D-1E or 2D-2E are performed so as to respectively form a built-up structure (not shown) at the first conductive layer 132" and the second conductive layer 134" and perform a separating process. The steps of forming the built-up structure and the separating process are roughly the same as the above-mentioned embodiments, which is omitted to describe. Since the first electronic device 152 and the second electronic device 154 are respectively disposed on the first release layer 110b and the second release layer 120b in the embodiment, so that after the separating process, two circuit boards with embedded devices (not shown) are formed, in which when the first electronic device 152 and the second electronic device 154 are active devices, the formed circuit boards are considered as an electronic package body.

In short, after forming the first release layers 110a and 110b and the second release layers 120a and 120b on the first surfaces 102a and 102b and the second surfaces 104a and 104b of the carrier boards 100a and 100b, but prior to forming the first built-up structures 170 and 170' and the second built-up structures 180 and 180', the conductive layers, the dielectric layers, the core layers or the electronic devices can be disposed on the first release layers 110a and 110b and the second release layers 120a and 120b depending on the application need. That is to say, the above-mentioned embodiments are exemplary implementations only, which the invention is not limited to. In addition, in other unshown embodiments, the user can arrange and combine carrier boards and release layers with different materials as the user's desire and select the parts in the above-mentioned embodiments. For example, the first core layer 160a and the second core layer 160b can be a metal layer. The people skilled in the art can, referring to the above-mentioned embodiments, employ the above-mentioned parts according to the real need to achieve the required technical effect.

In the above-mentioned embodiments, the first release layers 110a and 110b and the second release layers 120a and 120b are respectively formed on the first surfaces 102a and 102b and the second surfaces 104a and 104b of the carrier boards 100a and 100b. Hence, after finishing the successive process for forming the built-up structures (including the first built-up structures 170 and 170' and the second built-up structures 180 and 180'), a separating process is performed and meanwhile two circuit boards (including the first circuit boards 202a and 202b and the second circuit boards 204a and 204b) are formed. In another embodiment however, instead of two release layers, only one release layer is formed on a surface of the carrier board 100a or 100b (for example, the first surface 102a or 102b or the second surface 104a or 104b). Another process of electronic structure provided by the invention is depicted as follows.

It should be noted that the notations and partial content in the above-mentioned embodiment are continuously used, in which the same notations represent the same as or similar to the above-mentioned embodiment, while the same depictions are omitted and can be understood referring to the above-mentioned embodiment.

Figure 4A:
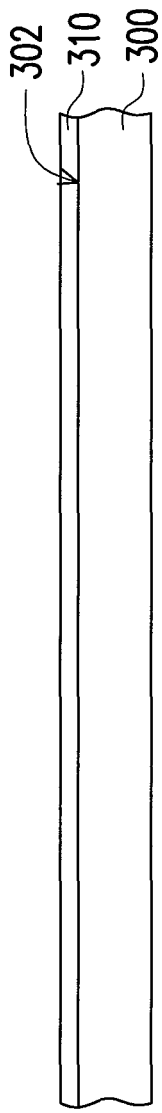
FIGS. 4A-4D are cross-sectional diagrams showing a process of electronic structure according to an embodiment of the invention.
Figure 4B:
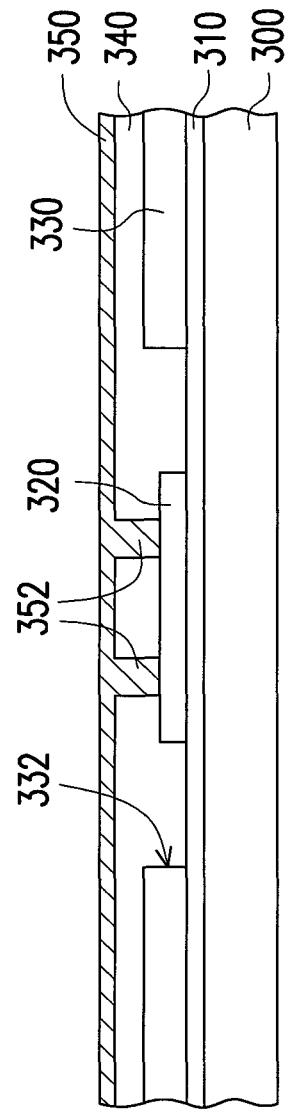
Figure 4C:
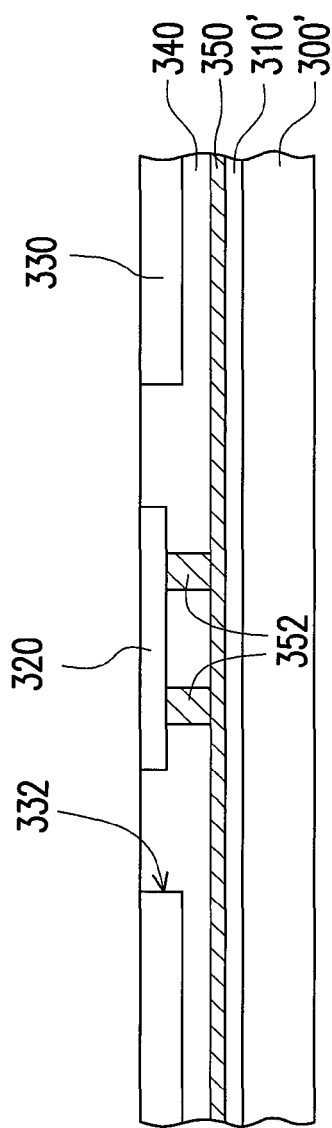
Figure 4D:
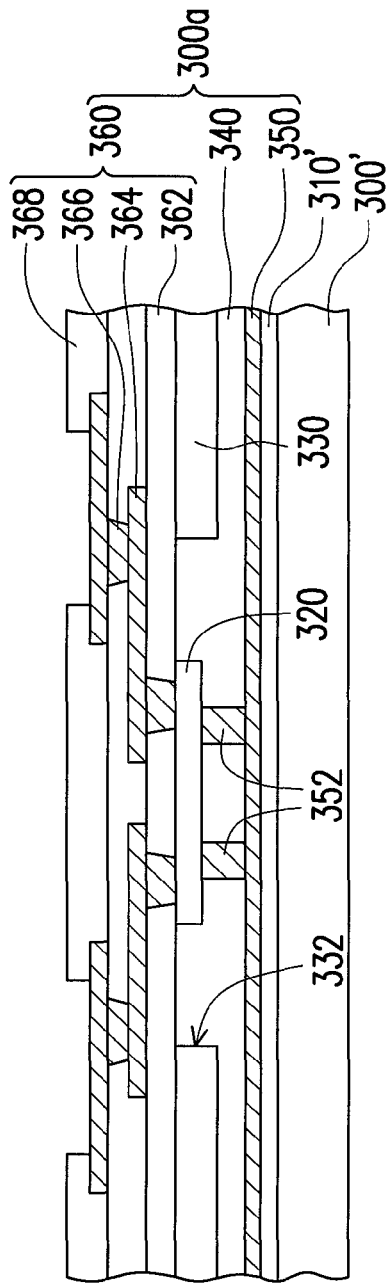

FIGS. 4A-4D are cross-sectional diagrams showing a process of electronic structure according to an embodiment of the invention. Referring to FIG. 4A, the process of electronic structure of the embodiment includes following steps. First, a carrier board 300 is provided, which has a surface 302, in which a release layer 310 has been formed already on the surface 302. Next referring to FIG. 4B, a built-up structure is formed on the release layer 310, in which the step of forming the built-up structure includes disposing an electronic device 320 and a supporting element 330 on the release layer 310. Since the release layer 310 has property of withstanding high-temperature and temporary adhesion capability, when the electronic device 320 and the supporting element 330 are disposed on the release layer 310, the electronic device 320 and the supporting element 330 can be adhered onto the surface 302 of the carrier board 300 through the release layer 310. In more details, the supporting element 330 has an opening 332 exposing and surrounding the electronic device 320, and the electronic device 320 is, for example, active device or passive device and the supporting element 330 is, for example, core layer or metal layer. Then referring to FIG. 4B, a dielectric layer 340 is formed and a metal layer 350 is formed on the dielectric layer 340, in which the dielectric layer 340 overlays the electronic device 320 and the supporting element 330, while the metal layer 350 is electrically connected to the electronic device 320 through a copper-plating blind via 352. The metal layer 350 can be patterned into traces and a cover layer such as a solder mask layer can be added on the top of metal layer 350 with finishing metal layers such as Ni and gold on 350 in solder mask opening areas (not shown). After that, a separating process and a board-transferring process are performed so as to align and join the surface 350 of the built-up structure to the release layer 310' on another carrier board 300' with adhesion capability to be connected to each other, while, at the same time releasing the adhesion at the interface between the built-up structure (including the electronic device 320, the supporting element 330, the dielectric layer 340 and the metal layer 350) and the release layer 310. At the time, the built-up structure is separated from the carrier board 300 and transferred to another carrier board 300', as shown by FIG. 4C. Further referring to FIG. 4D, a circuit structure 360 is formed on the electronic device 320 and the supporting element 330, in which the circuit structure 360 includes at least one dielectric layer 362, at least one conductive layer 364, at least one conductive through via 366 and a solder-resisting layer 368, where the configuring of the circuit structure 360 is not limited by the invention. The people skilled in the art can configure the electronic structure 300a by self according to the application need, followed by performing a separating process on the entire electronic structure 300a so as to be separated from the release layer 310' on the carrier board 300'. At the time, an electronic structure 300a is completed.

In other embodiments, in the fabrication process of the electronic structure 300a, prior to the separating process, one or a plurality of blind vias filled with metal can be formed in the dielectric layer 340 by using laser process or plating bump way, and the blind vias are connected to the electronic device 320, the dielectric layer 340 and the metal layer 350, in which the blind vias have conductive function or heat-conducting function.

Figure 5A:
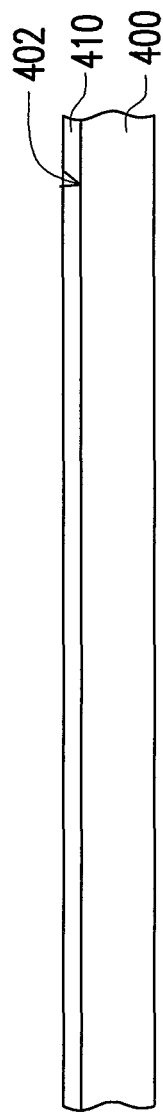
Figure 5B:
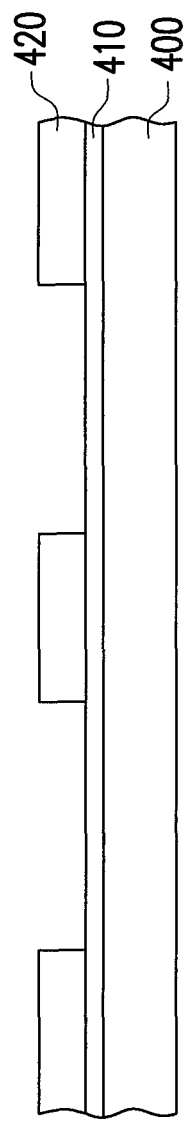

FIGS. 5A-5D are cross-sectional diagrams showing a process of electronic structure according to another embodiment of the invention. Referring to FIG. 5A, the process of electronic structure of the embodiment includes following steps. First, a carrier board 400 is provided, which has a surface 402, in which a release layer 410 has been formed already on the surface 402. Next referring to FIG. 5B, a built-up structure is formed on the release layer 410, in which the step of forming the built-up structure includes disposing a first solder-resisting layer 420 on the release layer 410. The first solder-resisting layer 420 is patterned to expose out a part of the release layer 410. Since the release layer 410 has property of withstanding high-temperature and temporary adhesion capability, when the first solder-resisting layer 420 is disposed on the release layer 410, the first solder-resisting layer 420 can be adhered onto the surface 402 of the carrier board 400 through the release layer 410. Then referring to FIG. 5C, a first patterned conductive layer 430, a dielectric layer 440, a second patterned conductive layer 450, a plurality of conductive through vias 460 and a second solder-resisting layer 470 are sequentially formed on the release layer 410 and the first solder-resisting layer 420, in which the conductive through vias 460 connect the first patterned conductive layer 430 and the second patterned conductive layer 450, and the second solder-resisting layer 470 exposes out a part of the second solder-resisting layer 470 and serves as a binding spot electrically connected to an external circuit. Finally referring to FIG. 5D, a separating process is performed, so that the adhesion at the interface between the built-up structure (including the first solder-resisting layer 420, the first patterned conductive layer 430, the dielectric layer 440, the second patterned conductive layer 450, the conductive through vias 460 and the second solder-resisting layer 470) and the release layer 410 is released. In this way, the built-up structure is separated from the carrier board 400 to expose out the first solder-resisting layer 420 and a part of the first patterned conductive layer 430, in which the exposed partial first patterned conductive layer 430 can serve as a bonding spot electrically connected to an external circuit. At the time, an electronic structure 400a is completed.

Figure 6A:
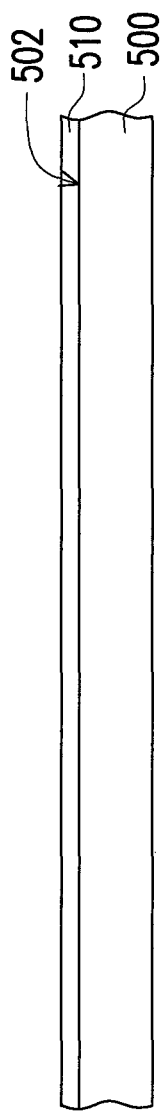
Figure 6B:
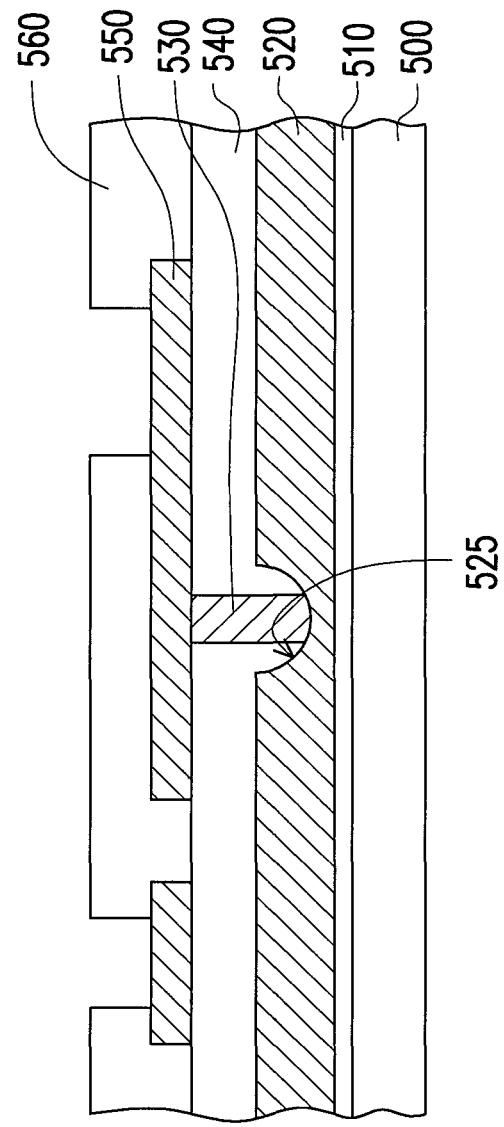
Figure 6E:
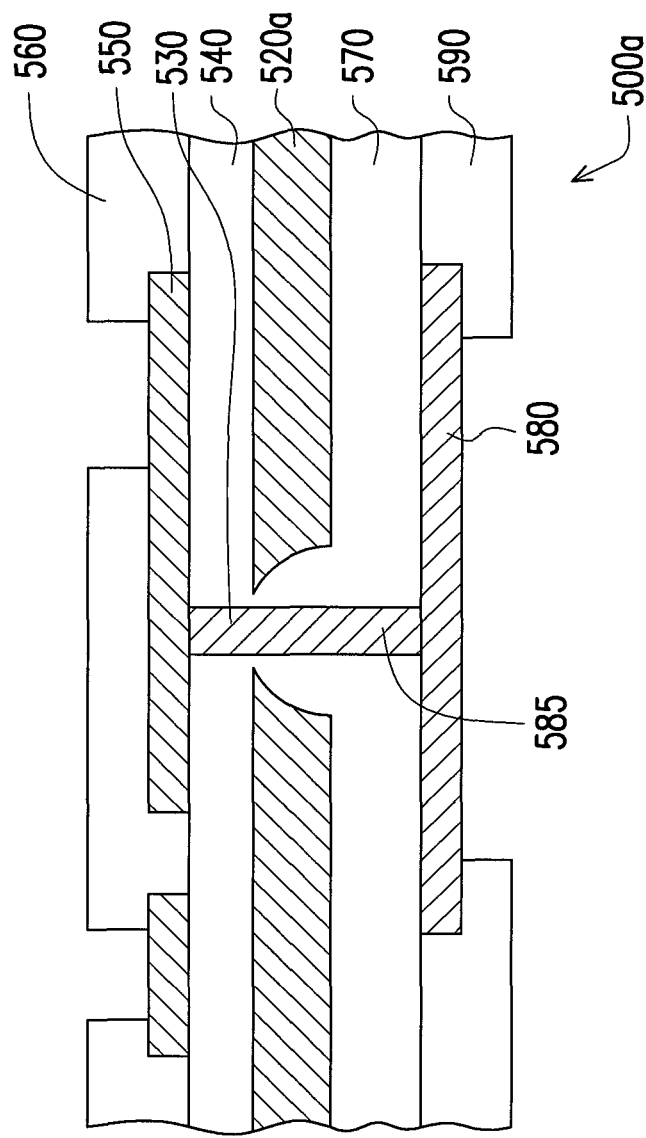

FIGS. 6A-6E are cross-sectional diagrams showing a process of electronic structure according to yet another embodiment of the invention. Referring to FIG. 6A, the process of electronic structure of the embodiment includes following steps. First, a carrier board 500 is provided, which has a surface 502, in which a release layer 510 has been formed already on the surface 502. Next referring to FIG. 6B, a built-up structure is formed on the release layer 510, in which the step of forming the built-up structure includes disposing a metal layer 520 on the release layer 510. Since the release layer 510 has property of withstanding high-temperature and temporary adhesion capability, when the metal layer 520 is disposed on the release layer 510, the metal layer 520 can be adhered onto the surface 502 of the carrier board 500 through the release layer 510. Then, a recess 525 is formed on the metal layer 520. Further a conductive pillar 530 and a dielectric layer 540 are formed on the metal layer 520, in which the conductive pillar 530 is located in the recess 525 and the dielectric layer 540 overlays the metal layer 520, encapsulates the conductive pillar 530 and fills into the recess 525. Further, a patterned conductive layer 550 is formed on the dielectric layer 540 and a solder-resisting layer 560 is formed on the patterned conductive layer 550, in which the patterned conductive layer 550 is electrically connected to the metal layer 520 through the conductive pillar 530, while the solder-resisting layer 560 exposes out a part of the patterned conductive layer 550 and serves as a bonding spot electrically connected to an external circuit. Then referring to FIG. 6C, a separating process and a board-transferring process are performed so as to release the adhesion at the interface between the built-up structure (including the metal layer 520, the conductive pillar 530, the dielectric layer 540, the patterned conductive layer 550 and the solder-resisting layer 560) and the release layer 510. In this way, the built-up structure is separated from the carrier board 500 and the metal layer 520 is exposed, followed by up-and-down turning over the built-up structure so that the originally most upper solder-resisting layer 560 is transferred to the most lower position and fixed onto the release layer 510' and another carrier board 500'. Further referring to FIG. 6D, an opening 528 is formed on the surface of the metal layer 520 far away from the dielectric layer 540, in which the opening 528 exposes out an end of the conductive pillar 530. The conductive pillar 530 is plated so as to be higher than the metal layer 520 (not shown). Further, an insulation layer 570 is formed in the opening 528 and on the surface of the metal layer 520 far away from the dielectric layer 540. Further referring to FIG. 6E, a conductive layer 580 is formed on the insulation layer 570 to form a conductive through via 585 going through the insulation layer 570 and electrically connected to the conductive layer 580 and the conductive pillar 530 and a solder-resisting layer 590 exposing a part of the conductive layer 580. At the time, an electronic structure 500a is completed, and the built-up structure 500a is separated from the carrier board 500' from the release layer 510'.

In summary, since the process of electronic structure in the invention adopts a release layer with property of withstanding high-temperature and temporary adhesion capability, and the release layer entirely overlays the two opposite surfaces of the carrier board, the adhesion between the release layer and the built-up structure successively formed on the release layer is strong enough during fabrication and avoids the built-up structure and the carrier board from peeling or falling off. In addition, the invention can make two circuit boards in a single process so as to reduce the cost.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive.

What is claimed is:

1. A process of an electronic structure, comprising:
   providing a carrier board with a first surface;
   forming a first release layer on the first surface of the carrier board, wherein the first release layer has property of temporary adhesion capability and the first release layer entirely or mostly overlays the first surface;
   forming a built-up structure on the first release layer, wherein step of forming the built-up structure comprises at least disposing a conductive layer, a dielectric layer, a conductive blind via passing through the dielectric layer, a core layer or an electronic device on the first release layer of the carrier board;
   after forming the built-up structure on the first release layer, providing another carrier board with another release layer, wherein the another carrier board is aligned and adhered on the built-up structure;
   separating the built-up structure from the carrier board on the edges so as to be transferred onto the another carrier board by using a physical lift-off process;
   turning-over the built-up structure and forming another built-up structure on the built-up structure; and
   performing a separating process so that the built-up structure is separated from the carrier board to form an electronic structure.

2. The process of the electronic structure as claimed in claim 1, wherein a material of the first release layer comprises siloxane, silicone or resin comprising thermoplastic resin with amide base, ester base or ether base component.

3. The process of the electronic structure as claimed in claim 1, wherein a material of the first release layer comprises high-temperature pressure-sensitive adhesive.

4. The process of the electronic structure as claimed in claim 1, wherein a material of the first release layer comprises metal.

5. The process of the electronic structure as claimed in claim 4, wherein the metal comprises nickel or nickel alloy.

6. The process of the electronic structure as claimed in claim 1, wherein a first layer deposited on the first release layer is a dielectric layer.

7. The process of the electronic structure as claimed in claim 1, wherein a first layer deposited on the first release layer is a solder mask layer.

8. The process of the electronic structure as claimed in claim 1, wherein a material of the dielectric layer comprises glass fiber, resin, acrylic or polyimide.

9. The process of the electronic structure as claimed in claim 1, wherein the core layer is formed by a glass fiber epoxy layer and two copper layers located on two opposite surfaces of the glass fiber epoxy layer.

10. The process of the electronic structure as claimed in claim 1, wherein the interface to separate the built-up structure from the first release layer is a planar surface, and material on the planar surface is substantially composed of the dielectric layer, the conductive layer, the core layer and the electronic device.

11. The process of the electronic structure as claimed in claim 1, wherein the core layer is a metal layer.

12. The process of the electronic structure as claimed in claim 11, wherein the material of the metal layer comprises copper, molybdenum or iron-nickel alloy.

13. The process of the electronic structure as claimed in claim 1, wherein the built-up structure further comprises a conductive pillar embedded in the dielectric layer and electrically connected to the conductive layer.

14. The process of the electronic structure as claimed in claim 1, wherein the electronic device comprises active device or passive device.

15. The process of the electronic structure as claimed in claim 1, wherein the core layer has an opening and the opening exposes out the electronic device.

16. The process of the electronic structure as claimed in claim 1, wherein the method of forming the built-up structure comprises laminating method, etching process, semi-additive process (SAP), laser drilling process and photolithography process.

17. The process of the electronic structure as claimed in claim 1, wherein step of forming the other built-up structure comprises at least disposing a conductive layer, a dielectric layer, a conductive blind via passing through the dielectric layer, a core layer or an electronic device.

18. The process of the electronic structure as claimed in claim 1, wherein the conductive blind via is a symmetric structure.

19. The process of the electronic structure as claimed in claim 1, wherein the built-up structure is separated from the other carrier.

20. The process of the electronic structure as claimed in claim 1, wherein method of the separating process comprises physical lift-off process.

21. The process of the electronic structure as claimed in claim 1, wherein a material of the carrier board comprises a metallic material, dielectric material or compound material.

22. The process of the electronic structure as claimed in claim 21, wherein the metallic material comprises copper, stainless steel or aluminium.

23. The process of the electronic structure as claimed in claim 21, wherein the dielectric material or the compound material comprises glass, ceramic, glass fiber epoxy clad by copper foil or polyimide.

24. The process of the electronic structure as claimed in claim 1, wherein the thickness of the carrier board ranges between 0.1 mm and 2.0 mm.

25. The process of the electronic structure as claimed in claim 1, wherein the carrier board further comprises a second surface, and during forming the first release layer, the process further comprises forming a second release layer on the second surface of the carrier board.

* * * * *